(12) United States Patent
Yokomizo et al.

(10) Patent No.: US 12,073,994 B2
(45) Date of Patent: Aug. 27, 2024

(54) ELECTRONIC COMPONENT INCLUDING SOLDER LAYER WITH SOLDER UNFILLED REGION

(71) Applicant: Murata Manufacturing Co., Ltd., Nagaokakyo (JP)

(72) Inventors: Satoshi Yokomizo, Nagaokakyo (JP); Shinobu Chikuma, Nagaokakyo (JP); Yohei Mukobata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/752,902

(22) Filed: May 25, 2022

(65) Prior Publication Data

US 2022/0384100 A1    Dec. 1, 2022

(30) Foreign Application Priority Data

May 31, 2021    (JP) ................................. 2021-091544

(51) Int. Cl.
| | | |
|---|---|---|
| *H01G 2/06* | (2006.01) | |
| *H01G 4/008* | (2006.01) | |
| *H01G 4/12* | (2006.01) | |
| *H01G 4/232* | (2006.01) | |
| *H01G 4/248* | (2006.01) | |
| *H01G 4/30* | (2006.01) | |

(52) U.S. Cl.
CPC ............. *H01G 2/06* (2013.01); *H01G 4/008* (2013.01); *H01G 4/1227* (2013.01); *H01G 4/2325* (2013.01); *H01G 4/248* (2013.01); *H01G 4/30* (2013.01)

(58) Field of Classification Search
CPC ........ H01G 4/232; H01G 4/1227; H01G 4/008; H01G 4/30; H01G 4/2325; H01G 2/06
See application file for complete search history.

(56) References Cited

U.S. PATENT DOCUMENTS

| | | | |
|---|---|---|---|
| 10,446,323 B1 * | 10/2019 | Son ......................... | H01G 4/30 |
| 2003/0034554 A1 * | 2/2003 | Onitani ................... | H01L 23/66 |
| | | | 257/E23.062 |

(Continued)

FOREIGN PATENT DOCUMENTS

| | | | |
|---|---|---|---|
| JP | 07171696 A | * | 7/1995 |
| JP | 2004-134430 A | | 4/2004 |

(Continued)

*Primary Examiner* — David M Sinclair
(74) *Attorney, Agent, or Firm* — Keating & Bennett, LLP

(57) ABSTRACT

An electronic component includes an electronic element and an interposer board. The electronic element includes a multilayer body and external electrodes at a pair of multilayer body end surfaces of the multilayer body and connected to internal electrode layers. The interposer board includes board end surfaces, board side surfaces orthogonal to the board end surfaces, and board main surfaces orthogonal to the board end surfaces and the board side surfaces. One of the pair of board main surfaces is located in a vicinity of the electronic element and joined with one of the multilayer body main surfaces in a vicinity of the interposer board. The interposer board is an alumina board. A solder layer is provided between the electronic element and the interposer board, joins the electronic element with the interposer board, and includes a solder unfilled region.

17 Claims, 9 Drawing Sheets

(56) References Cited

U.S. PATENT DOCUMENTS

| | | | |
|---|---|---|---|
| 2004/0066589 A1 | 4/2004 | Togashi et al. | |
| 2007/0245852 A1* | 10/2007 | Takaoka | B23K 35/362 |
| | | | 75/255 |
| 2009/0008776 A1* | 1/2009 | Kitae | H01L 24/11 |
| | | | 257/737 |
| 2014/0299986 A1* | 10/2014 | Sakurai | H01L 24/81 |
| | | | 257/737 |
| 2015/0122534 A1* | 5/2015 | Park | H01G 2/065 |
| | | | 174/260 |
| 2015/0270065 A1* | 9/2015 | Hattori | H01G 4/232 |
| | | | 174/255 |
| 2016/0268050 A1* | 9/2016 | Hattori | H01C 1/012 |
| 2017/0105283 A1* | 4/2017 | Kim | H05K 1/032 |
| 2017/0316883 A1* | 11/2017 | Yamaguchi | B32B 18/00 |
| 2018/0137981 A1* | 5/2018 | Vaughan | H01G 4/232 |
| 2019/0066918 A1* | 2/2019 | Jeong | H01G 4/005 |
| 2020/0006003 A1* | 1/2020 | Jeong | H01G 4/008 |
| 2020/0211774 A1* | 7/2020 | Onodera | H01G 4/248 |

FOREIGN PATENT DOCUMENTS

| | | | |
|---|---|---|---|
| JP | 2005167045 A | * | 6/2005 |
| JP | 2006019504 A | * | 1/2006 |

* cited by examiner

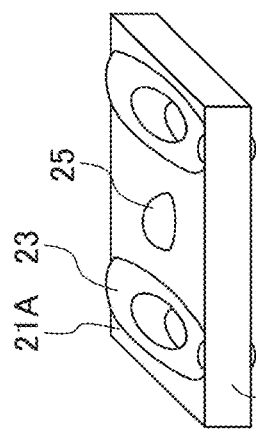
FIG. 4D
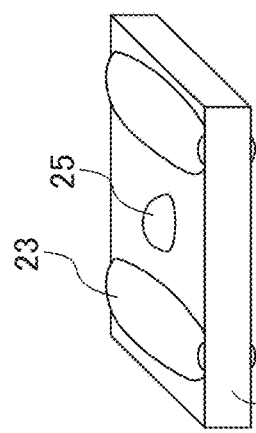
FIG. 4C
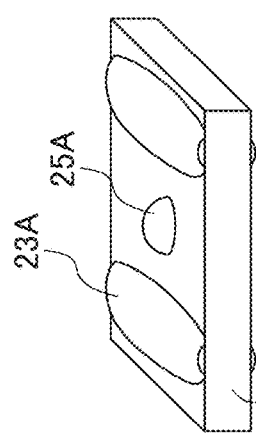
FIG. 4B
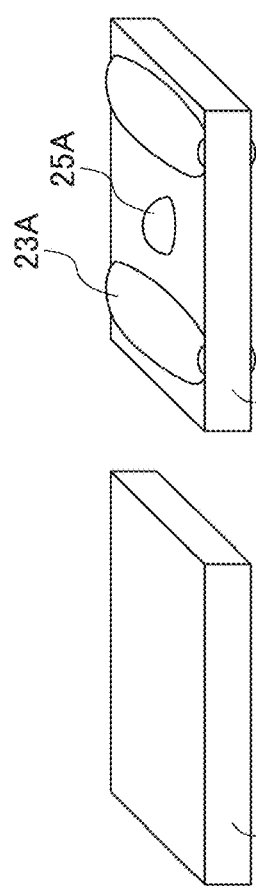
FIG. 4A
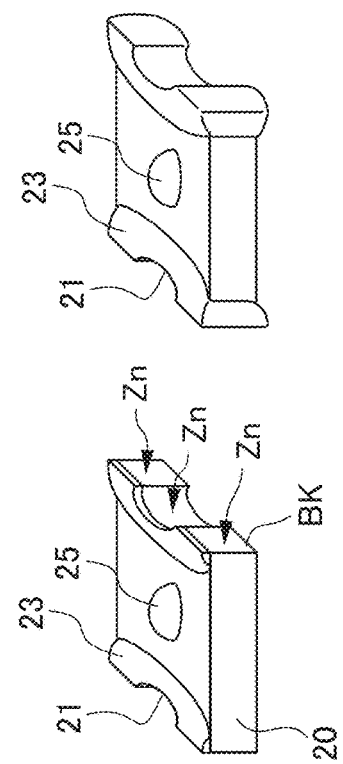
FIG. 4H
FIG. 4G
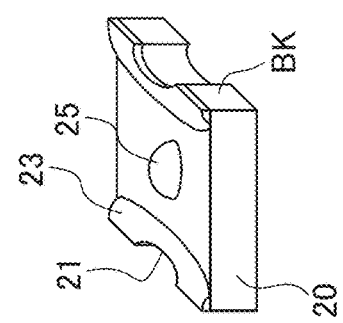
FIG. 4F
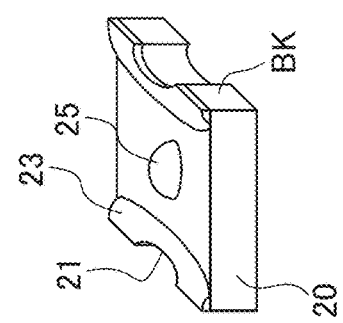
FIG. 4E
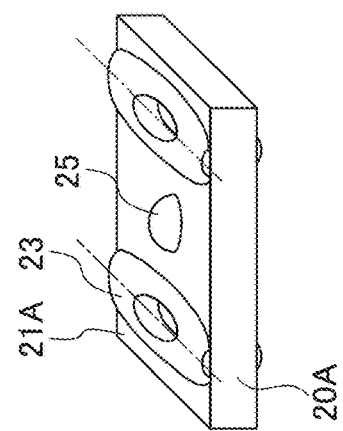

ELECTRONIC COMPONENT INCLUDING SOLDER LAYER WITH SOLDER UNFILLED REGION

CROSS REFERENCE TO RELATED APPLICATIONS

This application claims the benefit of priority to Japanese Patent Application No. 2021-091544 filed on May 31, 2021. The entire contents of this application are hereby incorporated herein by reference.

BACKGROUND OF THE INVENTION

1. Field of the Invention

The present invention relates to an electronic component.

2. Description of the Related Art

Japanese Unexamined Patent Application Publication No 2004-134430 discloses an electronic component in which, in order to reduce the generation of noise by reducing the propagation of vibrations, a single interposer board including a glass epoxy resin as a main material is provided at the lower portion of an electronic element which functions as a main body portion of the multilayer capacitor.

However, in recent years, there has been demand for an electronic component including an interposer board that is more resistant to deflection than an interposer board made of glass epoxy resin.

SUMMARY OF THE INVENTION

Preferred embodiments of the present invention provide electronic components, each including an interposer board resistant to deflection.

An electronic component according to a preferred embodiment of the present invention includes an electronic element, and an interposer board, wherein the electronic element includes a rectangular or substantially rectangular multilayer body including dielectric layers and internal electrode layers which are alternately laminated, a pair of multilayer body end surfaces orthogonal or substantially orthogonal to the internal electrode layers, a pair of multilayer body side surfaces orthogonal or substantially orthogonal to the multilayer body end surfaces, and a pair of multilayer body main surfaces orthogonal or substantially orthogonal to the multilayer body end surfaces and the multilayer body side surfaces, and external electrodes each on a respective one of the pair of multilayer body end surfaces of the multilayer body and connected to the internal electrode layers, the interposer board including a pair of board end surfaces, a pair of board side surfaces orthogonal or substantially orthogonal to the board end surfaces, and a pair of board main surfaces orthogonal or substantially orthogonal to the board end surfaces and the board side surfaces, one of the pair of board main surfaces is located in a vicinity of the electronic element and joined with one of the pair or multilayer body main surfaces in a vicinity of the interposer board, the interposer board is an alumina board, a solder layer is provided between the electronic element and the interposer board, joins the electronic element with the interposer board, and includes a solder unfilled region.

According to preferred embodiments of the present invention, it is possible to provide electronic components, each including an interposer board resistant to deflection.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4A is a diagram of a method of manufacturing an interposer board 20 according to a preferred embodiment of the present invention.

FIG. 4B is a diagram of a method of manufacturing an interposer board 20 according to a preferred embodiment of the present invention.

FIG. 4C is a diagram of a method of manufacturing an interposer board 20 according to a preferred embodiment of the present invention.

FIG. 4D is a diagram of a method of manufacturing an interposer board 20 according to a preferred embodiment of the present invention.

FIG. 4E is a diagram of a method of manufacturing an interposer board 20 according to a preferred embodiment of the present invention.

FIG. 4F is a diagram of a method of manufacturing an interposer board 20 according to a preferred embodiment of the present invention.

FIG. 4G is a diagram of a method of manufacturing an interposer board 20 according to a preferred embodiment of the present invention.

FIG. 4H is a diagram of a method of manufacturing an interposer board 20 according to a preferred embodiment of the present invention.

DETAILED DESCRIPTION OF THE PREFERRED EMBODIMENTS

Preferred embodiments of the present invention will be described below with reference to the drawings.

First Preferred Embodiment

Figure 1:
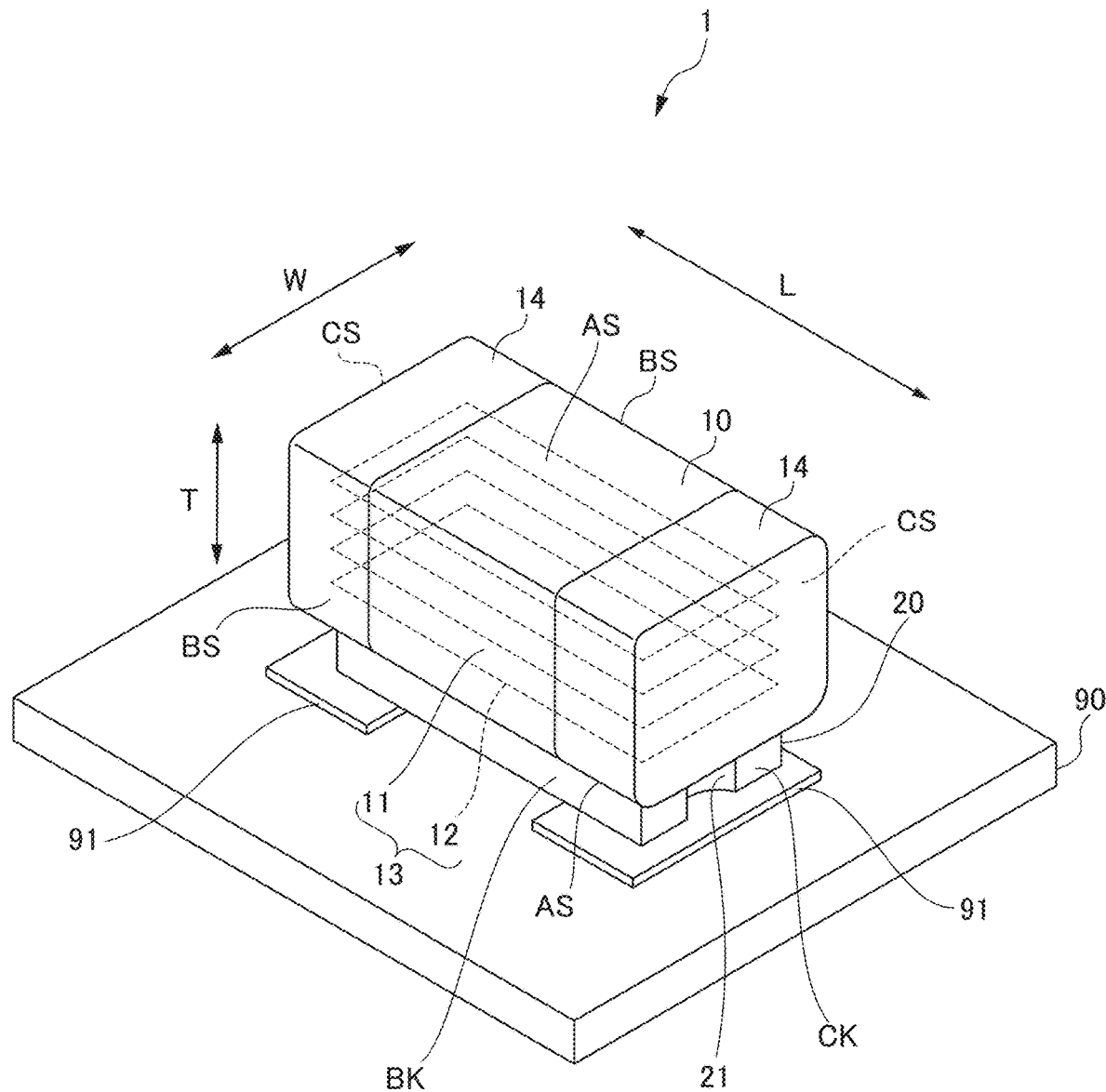
FIG. 1 is a perspective view of an electronic component 1 according to a preferred embodiment of the present invention mounted on a circuit board 90.
Figure 2:
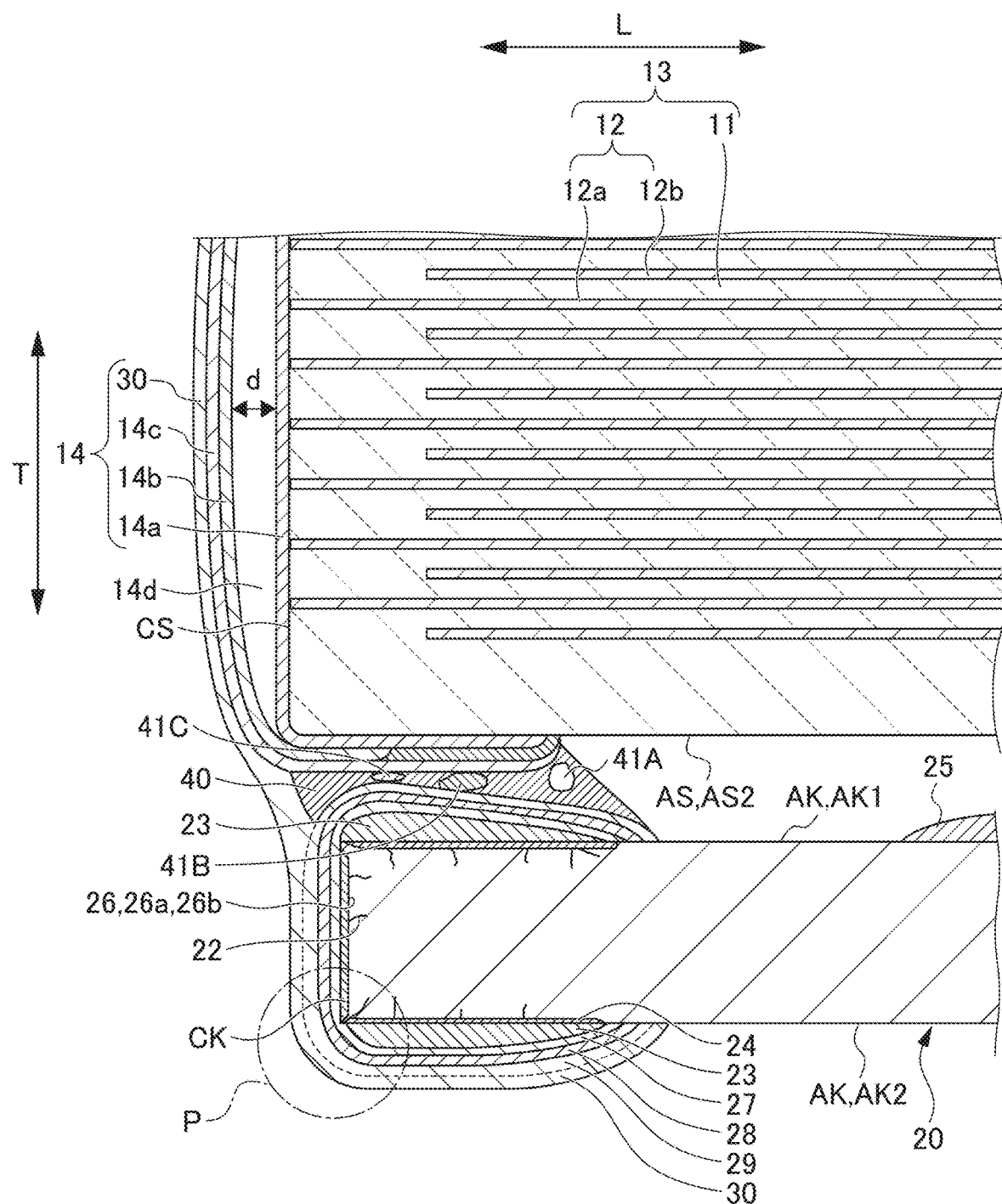
FIG. 2 is a partial enlarged cross-sectional view of the electronic component 1 according to a preferred embodiment of the present invention.

FIG. 1 is a perspective view of an electronic component according to a first preferred embodiment of the present invention mounted on a circuit board 90. FIG. 2 is a partial enlarged cross-sectional view of the electronic component 1 according to the first preferred embodiment of the present invention. The electronic component 1 includes an electronic element 10 and an interposer board 20. The interposer board 20 is attached to the electronic element 10. The electronic component 1 is mounted on the circuit board 90. The circuit board 90 includes lands 91 on a surface thereof. The lands 91 are each connected to the interposer board 20.

Electronic Element 10

The electronic element 10 is, for example, a capacitor in the present preferred embodiment of the present invention, but is not limited thereto. The electronic element 10 may be, for example, an inductor, a thermistor, a piezoelectric, or a semiconductor or other elements. The electronic element 10 of the present preferred embodiment of the present invention includes a multilayer body 13 and a pair of external electrodes 14. The multilayer body 13 includes a rectangular or substantially rectangular parallelepiped shape. In the multilayer body 13, dielectric layers 11, and internal electrode layers 12 are alternately laminated. The pair of external electrodes 14 are provided on both end surfaces of the multilayer body 13.

Multilayer Body 13

The multilayer body 13 has a rectangular or substantially rectangular shape. The multilayer body 13 includes a pair of multilayer body end surfaces CS orthogonal or substantially orthogonal to the internal electrode layer 12, a pair of multilayer body side surfaces BS orthogonal or substantially orthogonal to the multilayer body end surface CS, and a pair of multilayer body main surfaces AS orthogonal or substantially orthogonal to the multilayer body end surface CS and the multilayer body side surface BS.

The electronic element 10 of the present preferred embodiment of the present invention is a horizontal mounting electronic element. In the horizontal mounting electronic element, the dielectric layers 11 and the internal electrode layers 12 are provided in parallel or substantially in parallel with the multilayer body main surface AS. However, the present invention is not limited to the horizontal mounting electronic element. The electronic element 10 of the present preferred embodiment of the present invention may be a vertical mounting electronic element. In the vertical mounting electronic element, the dielectric layers 11 and the internal electrode layers 12 are provided perpendicular or substantially perpendicular to the multilayer body main surface AS.

Dielectric Layer 11

The dielectric layers 11 each mainly include, for example, barium titanate or other components. However, the main component of the dielectric layers 11 is not limited to barium titanate. The main component of the dielectric layer 11 may include a ceramic having a high dielectric constant, such as, for example, calcium titanate or strontium titanate. The dielectric layers 11 may include at least one kind of sub-component such as, for example, Mn compounds, Fe compounds, Cr compounds, Co compounds and Ni compounds. Furthermore, the dielectric layers 11 may include, for example, Si, glass components, and other components.

Internal Electrode Layer 12

The internal electrode layers 12 are provided by printing a paste including, for example, Ni on a ceramic sheet of the dielectric layers 11. However, the main material of the internal electrode layers 12 is not limited to Ni. The main material of the internal electrode layers 12 may include an alloy of Pd and Ag, for example.

External Electrodes 14

The external electrodes 14 are respectively provided on the pair of multilayer body end surfaces CS of the multilayer body 13. The external electrodes 14 each cover not only the multilayer body end surface CS, but also the multilayer body main surface AS and the multilayer body side surface BS in a vicinity of the multilayer body end surface CS.

As shown in FIG. 2, in the internal electrode layers 12, an internal electrode layer 12a and an internal electrode layer 12b are adjacent and oppose each other. The internal electrode layer 12a is electrically connected to one of the external electrodes 14 provided on one of the multilayer body end surfaces CS. The internal electrode layer 12b is electrically connected to the other one of the external electrodes 14 provided on the other one of the multilayer body end surface CS.

In the following description, the direction extending from one of the multilayer body end surfaces CS of the electronic element 10 to the other one of the multilayer body end surfaces CS is defined as the length direction L. The direction extending from one of the multilayer body side surfaces BS of the electronic element 10 to the other one of the multilayer body side surfaces BS is defined as the width direction W. The direction extending from one of the multilayer body main surfaces AS of the electronic element 10 to the other one of the multilayer body main surfaces AS is defined as the thickness direction T.

Size of Electronic Element 10

In the electronic element 10, the distance between the pair of multilayer body end surfaces CS is defined as the length LS. The distance between the pair of multilayer body side surfaces BS is defined as the width WS. The distance between a pair of multilayer body main surfaces AS is defined as the thickness TS. In this case, in the electronic element 10 of the present preferred embodiment of the present invention, for example, the length LS is about 2.01 mm to about 2.20 mm, the width WS is about 1.30 mm to about 1.50 mm, and the thickness TS is about 1.70 mm to about 1.9 mm. The thickness of each of the dielectric layers 11 is preferably about 0.4 μm to about 0.8 μm, and may be about 0.4 μm to about 1.0 μm, for example. The thickness of each of the internal electrode layers 12 is preferably about 0.4 μm to about 0.8 μm, and may be about 0.4 μm to about 1.0 μm, for example.

However, the present invention is not limited thereto, and other sizes may be used. For example, in the electronic element 10, for example, the length LS may be about 3.1 mm to about 3.3 mm, the width WS may be about 1.5 mm to about 2.7 mm, and the thickness TS may be about 1.5 mm to about 2.7 mm. In this case, the thickness of each of the dielectric layers 11 is preferably about 0.4 μm to about 0.8 μm, and may be about 0.4 μm to about 1.0 μm, for example. The thickness of each of the internal electrode layers 12 is preferably about 0.4 μm to about 0.8 μm, and may be about 0.4 μm to about 1.0 μm, for example.

As shown in FIG. 2, the external electrodes 14 each include, for example, from the side of the multilayer body end surface CS, a Cu (copper) electrode layer 14a, an electrically conductive resin layer 14b provided on the outer periphery of the Cu electrode layer 14a, a Ni (nickel) plated layer 14c provided on the outer periphery of the electrically conductive resin layer 14b, and a first Sn (tin) plated layer 30 provided on the outer periphery of the Ni plated layer 14c.

Cu Electrode Layer 14a

The Cu electrode layer 14a is provided by, for example, applying and baking a conductive paste including a conductive metal and glass. The Cu electrode layer 14a covers not only the multilayer body end surfaces CS on both sides of the multilayer body 13, but also a portion of the multilayer body main surface AS in the vicinity of the multilayer body end surface CS, and a portion of the multilayer body side surface BS in the vicinity of the multilayer body end surface CS.

Electrically Conductive Resin Layer 14b

The electrically conductive resin layer 14b covers the Cu electrode layer 14a at the outer periphery of the Cu electrode layer 14a. The electrically conductive resin layer 14b may include, for example, a thermosetting resin and a metal component.

As the thermosetting resin, various known thermosetting resins can be used. Specific examples of the thermosetting resin include, for example, epoxy resin, phenolic resin, urethane resin, silicone resin, and polyimide resin. As the metal component, for example, Ag or a metal powder coated with Ag on the surface of the base metal powder can be used. Similarly to the Cu electrode layer 14a, the electrically conductive resin layer 14b also covers not only the multilayer body end surface CS on both sides of the multilayer body 13, but also a portion of the multilayer body main surface AS in the vicinity of the multilayer body end surface CS and a portion of the multilayer body side surface BS in the vicinity of the multilayer body end surface CS.

The electrically conductive resin layer 14b includes, for example, a thermosetting resin. For this reason, the electrically conductive resin layer 14b is more flexible than, for example, a metal layer made of a plated film or a fired product of a conductive paste. Therefore, even when an impact caused by physical shock or thermal cycling acts on the electronic component 1, the electrically conductive resin layer 14b defines and functions as a buffer layer. Thus, cracks in the electronic component 1 are prevented from occurring. Furthermore, it is easy to absorb piezoelectric vibration, and it is possible to reduce or prevent the "noise".

Gap 14d

A gap 14d is provided between the Cu electrode layer 14a and the electrically conductive resin layer 14b. In the gap 14d, the distance d in the length direction L between the Cu electrode layer 14a and the electrically conductive resin layer 14b is largest at the middle portion in the width direction W and the thickness direction T in the multilayer body end surface CS where the Cu electrode layer 14a is provided. Furthermore, the distance between the Cu electrode layer 14a and the electrically conductive resin layer 14b decreases approaching the end portion of the multilayer body end surface CS in the vicinity of the multilayer body main surface AS or the multilayer body side surface BS. Furthermore, the gap 14d is eliminated or substantially eliminated at the corner portion and the ridgeline portion. As a result, the Cu electrode layer 14a and the electrically conductive resin layer 14b are in contact with each other. Thus, the distance d in the length direction L of the gap 14d is largest at the middle portion of the width direction W and the thickness direction T in the multilayer body end surface CS. Therefore, the external electrodes 14 each have a shape that bulges toward the length direction L.

Ni Plated Layer 14c

The Ni plated layer 14c covers the electrically conductive resin layer 14b at the outer periphery of the electrically conductive resin layer 14b. The Ni plated layer 14c includes, for example, plating of Ni or an alloy including Ni. Similarly to the Cu electrode layer 14a, the Ni plated layer 14c covers not only the multilayer body end surface CS on both sides of the multilayer body 13, but also a portion of the multilayer body main surface AS in the vicinity of the multilayer body end surface CS, and a portion of the multilayer body side surface BS in the vicinity of the multilayer body end surface CS.

First Sn Plated Layer 30

The first Sn plated layer 30 is provided at the outer periphery of the Ni plated layer 14c. The first Sn plated layer 30 includes, for example, plating of Sn or an alloy including Sn. The first Sn plated layer 30 may be a single layer. Although described later, the first Sn plated layer 30 integrally covers the outer periphery including the metal layer of the interposer board 20 with the interposer board 20 attached to the electronic element 10. The first Sn plated layer 30 may include, for example, two Sn-plated layers. In this case, the first Sn plated layer 30 may include, for example, a Sn plated layer covering only the Ni plated layer 14c of the electronic element 10 without covering the interposer board 20, between the Ni plated layer 14c and the first Sn plated layer 30.

Interposer Board 20

The interposer board 20 is a rectangular or substantially rectangular plate member. The interposer board 20 includes a pair of board end surfaces CK, a pair of board side surfaces BK perpendicular or substantially perpendicular to the board end surface CK, and a pair of board main surfaces AK perpendicular or substantially perpendicular to the board end surface CK and the board side surface BK. The pair of board end surfaces CK each include a recess 21. A board main surface AK1 in the vicinity of the electronic element which is one of the pair of board main surfaces AK is joined with a multilayer body main surface AS2 in the vicinity of the board which is one of the pair of multilayer body main surfaces AS of the electronic element 10.

Material

The interposer board 20 is, for example, an alumina board made of alumina. Alumina is generally harder than epoxy resin or the like, which is a common material for insulation boards. Therefore, it is possible to provide an electronic component including an interposer board 20 that is resistant to deflection. In addition, alumina is harder than epoxy resin or the like. This is also effective in reducing or preventing the noise.

Size

In the following, in the interposer board 20, the length between the pair of board end surfaces CK is defined as LK. The width between the pair of board side surfaces BK is defined as WK. The thickness between the pair of board main surfaces AK is defined as TK. The length LK between the pair of board end surfaces CK refers to a length between the pair of board end surfaces CK other than the portion where the recess 21 is provided, in the board end surface CK.

The width WK of the interposer board 20 is smaller than the width WS of the electronic element 10. The length LK of the interposer board 20 is smaller than the length LS of the electronic element 10. Therefore, the entire interposer board 20 is covered by the electronic element 10 in a plan view. Therefore, when mounting the interposer board 20 of the electronic component 1 on the circuit board 90, the arrangement is not limited due to the size of the interposer board 20. Furthermore, the interposer board 20 is not visible in a plan view. For this reason, it has excellent aesthetics.

Recess 21

Each of the pair of board end surfaces CK of the interposer board 20 includes a recess 21. The recess 21 has a semi-elliptical or substantially semi-elliptical shape in a plan view as shown in FIG. 1. By providing the recess 21, it is possible to accumulate a solder layer 40 to join the lands 91 of the electronic component 1 and the circuit board 90, in a space provided by the recess 21. Thus, it is possible to reduce or prevent wetting of the solder layer 40 on the end surface in the length direction L of the electronic element 10.

The shape in a plan view of the recess 21 is not limited to a semi-elliptical shape, and may be, for example, a polygonal or substantially polygonal shape or other shapes. However, for the purpose of increasing the area where the solder layer 40 is wetted while maintaining the bonding strength between the electronic element 10 and the interposer board 20, the shape of the recess 21 in a plan view is preferably semi-elliptical or substantially semi-elliptical. Such a semi-elliptical or substantially semi-elliptical shape is obtained by dividing the ellipse or an approximate ellipse having a main axis parallel or substantially parallel to the width direction W of the interposer board 20 along this main axis.

Cu Fired Layer 23

The Cu fired layer 23 is provided on the board main surface AK of the interposer board 20 in the vicinity of the board end surface CK. By the Cu fired layer 23 being provided in this way, the adhesion force of the Cu plated layer provided on the outer periphery of the Cu fired layer 23 to the board main surface AK of the interposer board 20 is improved.

In the present preferred embodiment of the present invention, the Cu fired layer 23 is provided on both sides of the board main surface AK1 in the vicinity of the electronic element and the board main surface AK2 in the vicinity of the circuit board. The Cu fired layer 23 provided on the board main surface AK2 in the vicinity of the circuit board may be thinner than the Cu fired layer 23 provided on the board main surface AK1 in the vicinity of the electronic element.

The Cu fired layer 23 may be thinner from the board end surface CK toward the middle portion along the length direction L on the board main surface AK. Therefore, when mounting the electronic element 10 using solder 40A, the posture of the electronic element 10 is easily stabilized.

Diffusion Layer 24

Furthermore, the Cu fired layer 23 is provided on the board main surface AK of the interposer board 20 in the vicinity of the board end surface CK. Thus, on the board main surface AK of the interposer board 20 in the vicinity of the board end surface CK, the diffusion layer 24 including, for example, aluminum and Cu is provided between the Cu layer 27 and the interposer board 20 made of alumina.

Mark Portion 25

As shown in FIG. 2, a mark portion 25 is provided which includes, for example, Si at the middle portion in the length direction L and the width direction W of the board main surface AK of the interposer board 20. The mark portion 25 may be made of, for example, glass. The mark portion 25 may include, for example, Si and alumina. Since the mark portion 25 includes alumina, it is firmly attached to the interposer board 20 made of alumina. The mark portion 25 may be thinner than the Cu fired layer 23. Therefore, when mounting the electronic element 10 to the interposer board 20, the mark portion 25 provided at the middle portion in the length direction L and the width direction W does not contact the electronic element 10. Thus, the mounting of the electronic element 10 does not become unstable. The mark portion 25 is circular or substantially circular in the present preferred embodiment. However, the present invention is not limited thereto, and may be, for example, oval, substantially oval, triangular, or substantially triangular.

Furthermore, in the present preferred embodiment, the mark portion 25 is provided on the board main surface AK1 in the vicinity of the electronic element. As described above, the Cu fired layer 23 provided on the board main surface AK1 in the vicinity of the electronic element may be thicker than the Cu fired layer 23 provided on the board main surface AK2 in the vicinity of the circuit board.

Among the board main surfaces AK of the interposer board 20, the board main surface AK1 in the vicinity of the electronic element is attached to the electronic element 10. The board main surface AK1 in the vicinity of the electronic element includes the thicker Cu fired layer 23 thereon. However, the difference in thickness of the Cu fired layers 23 may be small. Therefore, the board main surface AK2 in the vicinity of the circuit board and the board main surface AK1 in the vicinity of the electronic element may be visually indistinguishable from each other when visually viewing the Cu fired layers 23. However, in the present preferred embodiment of the present invention, the mark portion 25 is provided on the main surface AK1 in the vicinity of the electronic element. As a result, the mark portion 25 defines and functions as a mark to identify the board main surface AK1 in the vicinity of the electronic element on which the Cu fired layer 23 is thicker. Thus, it is possible to attach the board main surface AK1 in the vicinity of the electronic element where the Cu fired layer 23 is thicker to the electronic element 10.

However, the present invention is not limited thereto. The mark portion 25 may be provided on the board main surface AK2 in the vicinity of the circuit board. When joining the electronic element 10 and the interposer board 20, there are cases where alignment using a camera is performed. In these cases, photographing is performed from the side of the interposer board 20. When the mark portion 25 is provided on the board main surface AK2 in the vicinity of the circuit board, the mark portion 25 is visible during the alignment using a camera. Therefore, the alignment is easily performed.

Zn-Containing Layer 26

The pair of board end surfaces CK of the interposer board 20 each include a Zn-containing layer 26 including Zn (zinc).

Metal Layer

The outer periphery of the Cu fired layer 23 and the Zn-containing layer 26 on the interposer board 20 in the vicinity of the board end surface CK includes a metal layer thereon. The metal layer includes, for example, a Cu layer 27, a Ni plated layer 28, and a second Sn plated layer 29.

Cu Layer 27

In the present preferred embodiment, the Cu layer 27 is, for example, a Cu plated layer. However, the present invention is not limited thereto. For example, a paste may be applied to the Cu layer 27. The Cu layer 27 covers not only the board end surfaces CK on both sides of the interposer board 20, but also a portion of the board main surface AK in the vicinity of the board end surface CK, and a portion of the board side surface BK in the vicinity of the board end surface CK.

Ni Plated Layer 28

The Ni plated layer 28 is provided on the outer periphery of the Cu layer 27. The Ni plated layer 28 covers the Cu layer 27. The Ni plated layer 28 may include, for example, plating of Ni or an alloy including Ni. Similarly to the Cu layer 27, the Ni plated layer 28 covers not only the board end surfaces CK on both sides of the interposer board 20, but also a portion of the board main surface AK in the vicinity of the board end surface CK and a portion of the board side surface BK in the vicinity of the board end surface CK. Furthermore, the external electrodes 14 each include the Ni plated layer 14c. However, the Ni plated layer 14c of the external electrode 14 is not connected to the Ni plated layer 28 of the interposer board 20.

Second Sn Plated Layer 29

The second Sn plated layer 29 is provided on the outer periphery of the Ni plated layer 28. The second Sn plated layer 29 covers the Ni plated layer 28. The second Sn plated layer 29 includes, for example, plating of Sn or an alloy including Sn. Similarly to the Cu layer 27, the second Sn plated layer 29 covers not only the board end surfaces CK on both sides of the interposer board 20, but also a portion of the board main surface AK in the vicinity of the board end surface CK and a portion of the board side surface BK in the vicinity of the board end surface CK.

First Sn Plated Layer 30

The first Sn plated layer 30 is provided on the outer periphery of second Sn plated layer 29. As described above, the first Sn plated layer 30 covers both the external electrode 14 of the electronic element 10 and the metal layer of the interposer board 20. The first Sn plated layer 30 is provided over the metal layer of the board end surface CK of the interposer board 20 from the external electrode 14 of the electronic element 10. Therefore, the first Sn plated layer 30 seamlessly connects the land 91 of the circuit board 90 and the external electrode 14 of the electronic element 10. As a result, excellent conductivity can be ensured.

Notch 22

Figure 3:
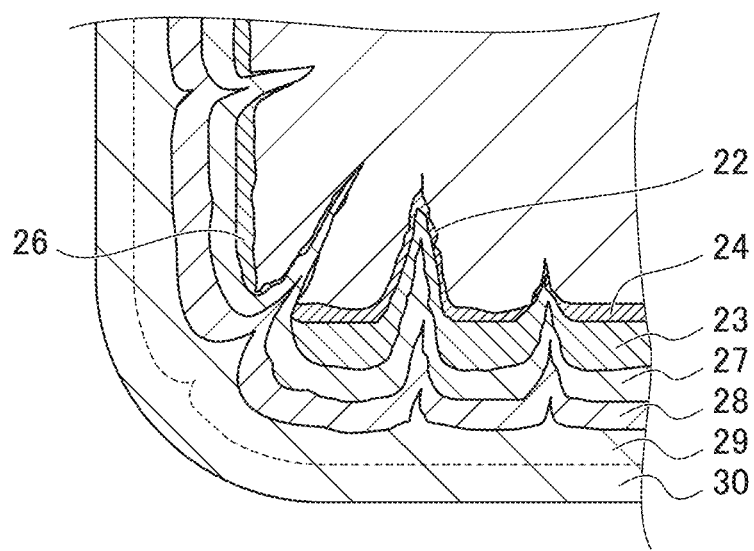
FIG. 3 is an enlarged view of a region P shown in FIG. 2.

FIG. 3 is an enlarged view of a region P shown in FIG. 2. Notches 22 are provided in the surface of the interposer board 20 in the vicinity of the board end surface CK. One or more of the notches 22 may be provided in a predetermined region. This region may include the board end surface CK, the board side surface BK in the vicinity of the board end surface CK, the board main surface AK in the vicinity of the board end surface CK, the ridge portion between the board end surface CK and the board side surface BK, the ridge portion between the board end surface CK and the board main surface AK, the ridge portion between the board side surface BK and the board main surface AK, and the corner portion among the board end surface CK, the board side surface BK, and the board main surface AK.

Advantageous Effects of Notch 22

The Cu fired layer 23, the Cu layer 27, the Ni plated layer 28, the second Sn plated layer 29, the first Sn plated layer 30, or the like provided on the outer periphery of the interposer board 20 may enter the interior of the notches 22 provided in the interposer board 20. Depending on the shape, position, depth, or size of the notch 22, the number and type of layers that enter may vary. Thus, the Cu fired layer 23, the Cu layer 27, the Ni plated layer 28, the second Sn plated layer 29, the first Sn plated layer 30, or the like enters the notches 22, which provides an anchoring effect. Due to the anchoring effect, it is possible to increase the adhesive force of the Cu fired layer 23, the Cu layer 27, the Ni plated layer 28, the second Sn plated layer 29, and the first Sn plated layer 30, to the interposer board 20.

Solder Layer 40

The solder layer 40 is provided between the electronic element 10 and the interposer board 20. The solder layer 40 joins the electronic element 10 and the interposer board 20. The solder layer 40 may be, for example, a Sn cream solder layer. The Sn cream solder layer may include a flux including, for example, a rosin, an activator, or a solvent. The solder layer 40 is provided between the external electrode 14 on the multilayer body main surface AS2 in the vicinity of the board of the electronic element 10, and a portion where the diffusion layer 24, the Cu fired layer 23, the Cu layer 27, the Ni plated layer 28, and the second Sn plated layer 29 on the board main surface AK1 in the vicinity of the electronic element of the interposer board 20 are provided.

The solder layer 40 may include a solder unfilled region 41. In the solder unfilled region 41, the solder is not filled. The solder unfilled region 41 includes a cavity region 41A and a flux region 41B, for example. The cavity region 41A may include, for example, air. The flux region 41B may include, for example, flux. The flux may be, for example, a rosin, an activator, or a solvent included in the Sn cream solder. The solder layer 40 includes the solder unfilled region 41 such as the cavity region 41A and the flux region 41B. With such a configuration, cushioning properties can be provided between the electronic element 10 and the interposer board 20. As a result, it is possible to reduce the transmission of impact to the electronic element 10 when an impact is applied to the circuit board 90. Furthermore, beads or the like having a cushioning property may be mixed into the Sn cream solder. This may provide a cushioning region 41C as the solder unfilled region 41.

Advantageous Effects of Interposer Board 20

As described above, the electronic component 1 in which the electronic element 10 and the interposer board 20 are joined is mounted on the circuit board 90. Thus, the electronic element 10 and the circuit board 90 sandwich the interposer board 20 such that the electronic element 10 and the circuit board 90 are connected to each other. The vibration generated from the electronic element 10 is attenuated when propagating through the interposer board 20. Thus, it is possible to reduce or prevent the audible sound generated by the vibration propagating to the circuit board 90.

Manufacturing Method

Figure 5:
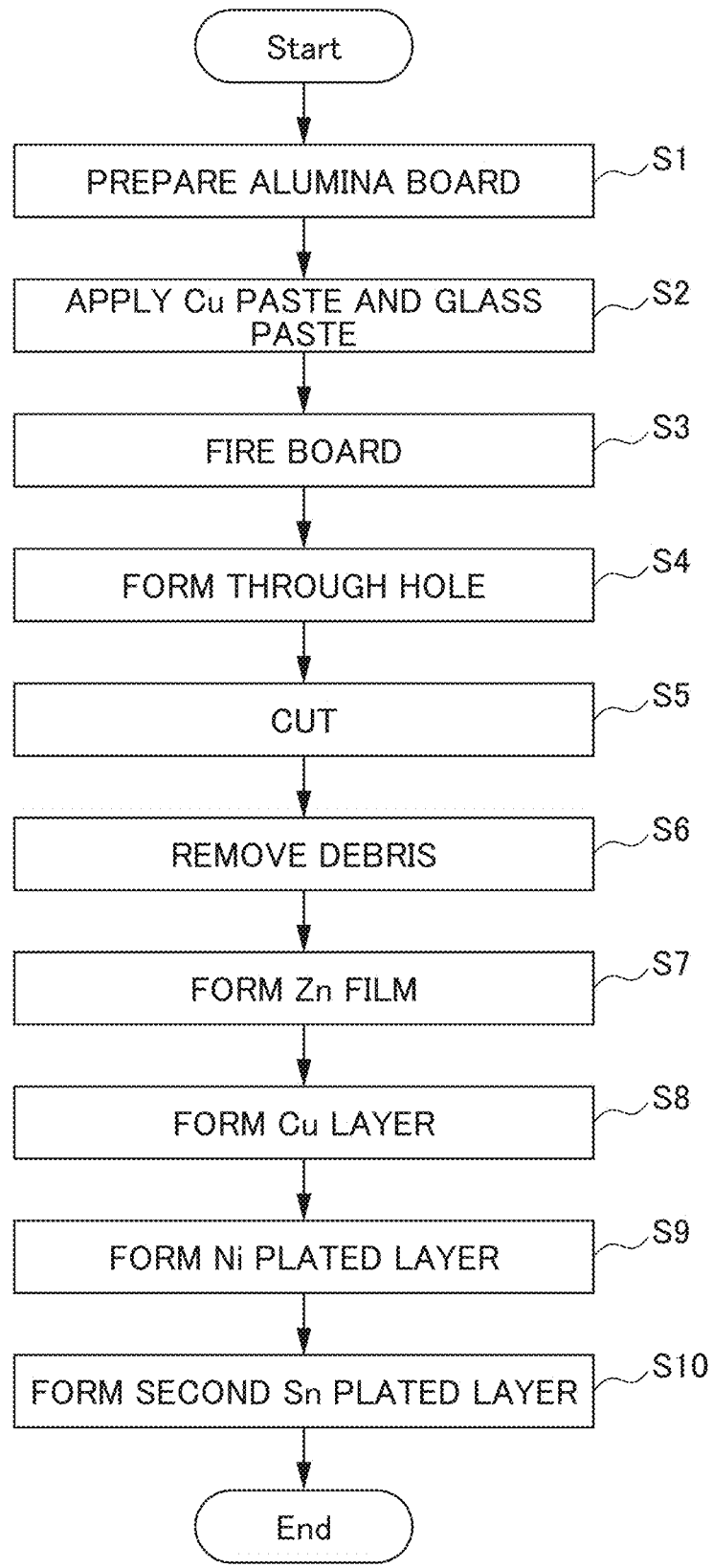
FIG. 5 is a flowchart of the method of manufacturing the interposer board 20 according to a preferred embodiment of the present invention.

Next, a non-limiting example of a manufacturing method of the electronic component 1 according to the present preferred embodiment of the present invention will be described. The method of manufacturing the electronic component 1 includes a method of manufacturing the interposer board 20 and a method of attaching the interposer board 20 and the electronic element 10. FIGS. 4A-4H are diagrams of a non-limiting example of a method of manufacturing the interposer board 20. FIG. 5 is a flowchart of such a method of manufacturing the interposer board 20.

Board Preparing Process

First, an elongated alumina board 20A having a predetermined width is prepared (FIG. 4A and Step S1 in FIG. 5).

Cu Paste and Glass Paste Application Process

A Cu paste 23A is applied along the width direction W to two coating positions which are spaced apart by a constant distance in the length direction L on the board main surface AK of the board 20A. Furthermore, a glass paste 25A forming the mark portion 25 is applied between the two coating positions. Either application of the Cu paste 23A and the glass paste 25A may be performed first (FIG. 4B and Step S2 in FIG. 5).

The Cu paste 23A may include, for example, a Cu powder and a binder.

The glass paste 25A may include, for example, a glass powder, an alumina powder, and a binder. The application of the Cu paste 23A and the application of the glass paste 25A are performed by, for example, screen printing.

The Cu paste 23A is applied to both surfaces of the board main surface AK1 in the vicinity of the electronic element of the board main surface AK and the board main surface AK2 in the vicinity of the circuit board of the board main surface AK. At this time, the Cu paste 23A may be applied thinner to the board main surface AK2 in the vicinity of the circuit board than the board main surface AK1 in the vicinity of the electronic element. In the present preferred embodiment of the present invention, the glass paste 25A is applied to the board main surface AK1 in the vicinity of the electronic element. The glass paste 25A may be applied thinner than the Cu paste 23A on the surface to be applied.

Board Firing Process

The board 20A is heated to fire the Cu paste 23A and the glass paste 25A, thus forming the Cu fired layer 23 and the mark portion 25 including Si (FIG. 4C and Step S3 in FIG. 5).

Through Hole Forming Process

The middle portion of the Cu fired layer 23 of the board 20A on which the Cu fired layer 23 and the mark portion 25 are fired is punched so as to penetrate in the thickness direction T, to form a through-hole 21A defining and functioning as the recess (FIG. 4D and Step S4 in FIG. 5).

Cutting Process

Two locations where the Cu fired layer 23 is provided on the board 20A are cut in a plane perpendicular or substantially perpendicular to the length direction L to form the interposer board 20 including the Cu fired layers 23 and the mark portion provided between the two locations where the Cu fired layers 23 are provided on the board main surface AK at both ends in the length direction L (FIG. 4E, and Step S5 of FIG. 5). The cutting may be performed by, for example, dicing or breaking. Dicing is a method of cutting using a dicer (dicing saw) that rotates at high speed. Breaking is a method in which a groove is formed in advance in the board 20A, and the groove is split along the groove.

Debris Removing Process

Next, debris on the board side surface BK of the interposer board 20, which is cut and exposed, is removed (FIG. 4F and Step S6 of FIG. 5).

Zn-Containing Layer Forming Process

The Zn-containing layer 26 is formed on the board side surface BK of the interposer board 20 from which debris is removed. The Zn-containing layer forming process is, for example, a zincate treatment. Therefore, the Zn-containing layer forming process is a pretreatment process for obtaining a Zn-containing layer having favorable adhesion to alumina including Al (aluminum), which is a less-noble metal than Zn. In general, when the board side surface BK is immersed in an aqueous solution (zincate processing solution) in which Zn is dissolved, Al dissolves as ions because Zn has a more noble standard oxidation-reduction potential than Al. Electrons are generated at this time, and Zn ions receive the electrons on the surface of the board side surface BK, to form the Zn-containing layer on the surface of the board side surface BK (FIG. 4G, and Step S7 of FIG. 5). Since the Zn-containing layer 26 is formed on the board side surface BK in this way, the adhesion of the metal layers formed on the board side surface BK such as the Cu layer 27, the Ni plated layer 28, and the second Sn plated layer 29 is improved.

Cu Layer Forming Process

The Cu layer 27 is formed on the outer periphery of the interposer board 20 in the vicinity of the board end surface CK at both ends in the length direction L (FIG. 4H, and Step S8 of FIG. 5). In the present preferred embodiment of the present invention, the Cu layer 27 is formed by Cu plating.

When the Cu plating is performed, since Zn is replaced by Cu, the Cu layer 27 is easily adhered to the board end surface CK. However, the Cu layer 27 is not limited to the plated layer. Here, not all Zn of the Zn-containing layer is replaced, and a portion of Zn remains on the board side surface BK, such that the Zn-containing layer 26 remains thin.

Ni Plated Layer Forming Process

The Ni plated layer 28 is formed on the outer periphery of the interposer board 20 where the Cu layer 27 is formed, in the vicinity of the board end surface CK at both ends in the length direction L (FIG. 4H and Step S9 of FIG. 5).

Second Sn Plated Layer Forming Process

The second Sn plated layer 29 is formed on the outer periphery of the interposer board 20 where the Ni plated layer 28 is formed, in the vicinity of the board end surface CK at both ends in the length direction L (FIG. 4H and Step S10 of FIG. 5).

Next, a non-limiting example of a method of attaching the interposer board 20 and the electronic element 10 will be described. FIGS. 6A-6D are diagrams of a method of attaching the interposer board 20 and the electronic element 10. FIG. 7 is a flowchart of a method of attaching the interposer board 20 and the electronic element 10.

Jig Holding Process

Figure 6A:
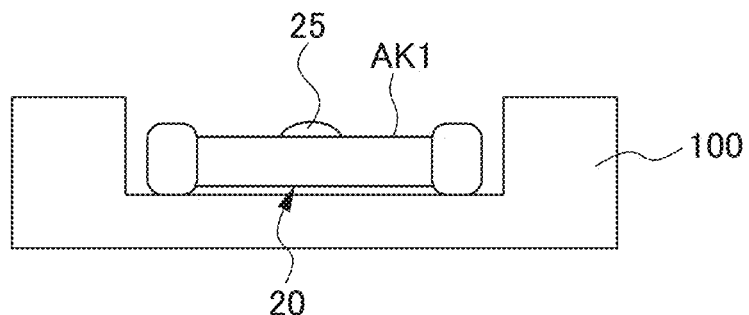
FIG. 6A is a diagram of a method of attaching the interposer board 20 and an electronic element 10 according to a preferred embodiment of the present invention.
Figure 7:
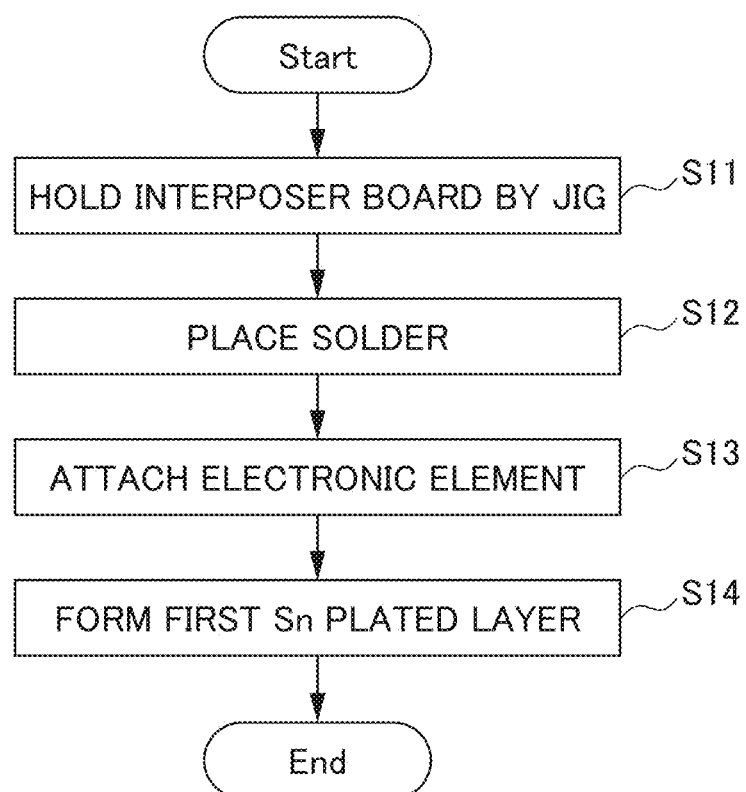
FIG. 7 is a flowchart of a method of attaching the interposer board 20 and the electronic element 10 according to a preferred embodiment of the present invention.

The interposer board 20 in which the Cu layer 27, the Ni plated layer 28, and the second Sn plated layer 29 are provided is provided and held in a jig 100 including a plurality of recessed insertion portions therein (FIG. 6A and Step S11 of FIG. 7).

Solder Providing Process

Figure 6B:
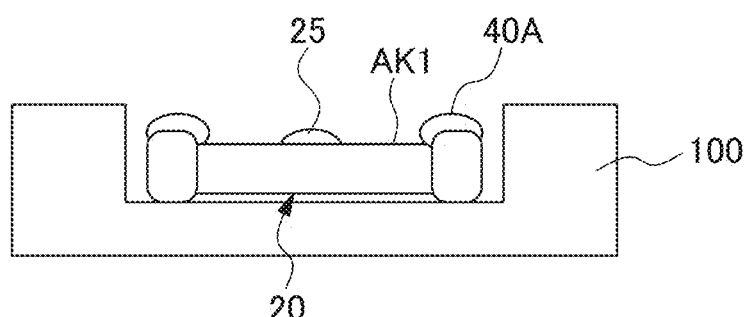
FIG. 6B is a diagram of a method of attaching the interposer board 20 and an electronic element 10 according to a preferred embodiment of the present invention.

The cream solder 40A is provided on the board main surface AK1 of the interposer board 20 in the vicinity of the electronic element which is one of the board main surfaces AK (FIG. 6B and Step S12 of FIG. 7).

Electronic Element Attaching Process

Figure 6C:
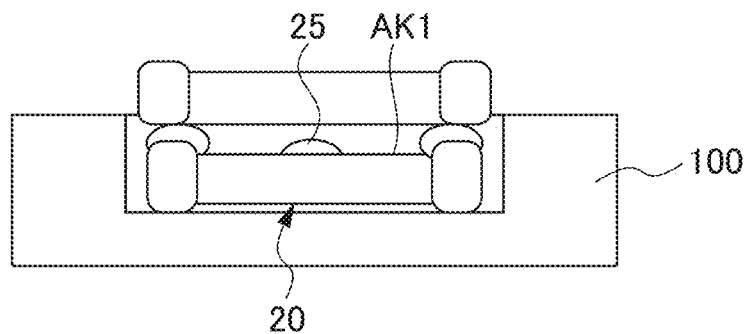
FIG. 6C is a diagram of a method of attaching the interposer board 20 and an electronic element 10 according to a preferred embodiment of the present invention.

The electronic element 10 is provided on the board main surface AK1 in the vicinity of the electronic element of the interposer board 20 on which the solder 40A is provided (FIG. 6C and Step S13 of FIG. 7).

First Sn Plated Layer Forming Process

Figure 6D:
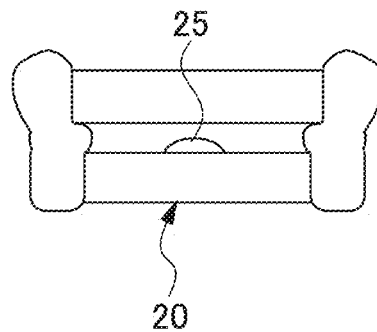
FIG. 6D is a diagram of a method of attaching the interposer board 20 and an electronic element 10 according to a preferred embodiment of the present invention.

The first Sn plated layer 30A is formed which covers both the external electrode 14 of the electronic element 10 and the metal layer of the interposer board 20 (FIG. 6D and Step S14 of FIG. 7).

Advantageous Effects of First Preferred Embodiment

As described above, according to the first preferred embodiment of the present invention, the interposer board 20 is an alumina board. Alumina is generally harder than epoxy resin or the like, which is a common material for insulation boards. Therefore, it is possible to provide an electronic component including the interposer board 20 that is resistant to deflection. In addition, alumina is harder than epoxy resin or the like. This is also effective in reducing or preventing noise.

The width WK of the interposer board 20 is smaller than the width WS of the electronic element 10. The length LK of the interposer board 20 is smaller than the length LS of the electronic element 10. Therefore, the entire interposer board 20 is covered by the electronic element 10 in a plan view. Therefore, when mounting the interposer board 20 of the electronic component 1 on the circuit board 90, the arrangement is not limited due to the size of the interposer board 20. Furthermore, the interposer board 20 is not visible in a plan view. For this reason, it has excellent aesthetics.

Each of the pair of board end surfaces CK of the interposer board 20 includes a recess 21. The recess 21 has a semi-elliptical or substantially semi-elliptical shape in a plan view as shown in FIG. 1. By providing the recess 21, it is possible to accumulate a solder layer 40 to join the lands 91 of the electronic component 1 and the circuit board 90, in a space provided by the recess 21. Thus, it is possible to reduce or prevent wetting of the solder layer 40 on the end surface in the length direction L of the electronic element 10.

The external electrodes 14 each include the electrically conductive resin layer 14b. The electrically conductive resin layer 14b includes a thermosetting resin. For this reason, the electrically conductive resin layer 14b is more flexible than, for example, a metal layer made of a plated film or a fired product of a conductive paste. Therefore, even when an impact caused by physical shock or thermal cycling on the electronic component 1 is applied, the electrically conductive resin layer 14b defines and functions as a buffer layer. Thus, cracks in the electronic component 1 are prevented from occurring. Furthermore, it is easy to absorb piezoelectric vibration, and it is possible to reduce or prevent "noise".

The Cu fired layer 23 is provided on the board main surface AK of the interposer board 20 in the vicinity of the board end surface CK. By the Cu fired layer 23 being provided in this way, the adhesion force of the Cu plated layer provided on the outer periphery of the Cu fired layer 23 to the board main surface AK of the interposer board 20 is improved.

The Cu fired layer 23 may be thinner from the board end surface CK toward the middle portion along the length direction L on the board main surface AK. Therefore, when mounting the electronic element 10 on the interposer board 20 using the solder 40A, the posture of the electronic element 10 is easily stabilized.

The notches 22 are provided on the surface of the interposer board 20 in the vicinity of the board end surface CK. The Cu fired layer 23, the Cu layer 27, the Ni plated layer 28, the second Sn plated layer 29, the first Sn plated layer 30, or the like provided on the outer periphery of the interposer board may enter the interior of the notches 22 provided in the interposer board 20. This provides an anchoring effect. Due to the anchoring effect, it is possible to increase the adhesive force of the Cu fired layer 23, the Cu layer 27, the Ni plated layer 28, the second Sn plated layer 29, and the first Sn plated layer 30, to the interposer board 20.

The first Sn plated layer 30 is provided. The first Sn plated layer 30 covers both the external electrode 14 of the electronic element 10 and the metal layer of the interposer board 20. The first Sn plated layer 30 is provided over the metal layer of the board end surface CK of the interposer board 20 from the external electrode 14 of the electronic element 10. Therefore, the first Sn plated layer 30 seamlessly connects the land 91 of the circuit board 90 and the external electrode 14 of the electronic element 10. As a result, excellent conductivity can be ensured.

The mark portion 25 is provided on the board main surface AK1 in the vicinity of the electronic element. As a result, the mark portion 25 defines and functions as a mark to identify the board main surface AK1 in the vicinity of the electronic element on which the Cu fired layer 23 is provided thicker.

The mark portion 25 includes alumina. Therefore, it is possible to firmly adhere to the interposer board 20 made of alumina.

The mark portion 25 is thinner than the Cu fired layer 23. Therefore, when mounting the electronic element 10 to the interposer board 20, the mark portion 25 provided at the middle portion in the length direction L and the width direction W does not contact the electronic element 10. Thus, the mounting of the electronic element 10 does not become unstable.

When joining the electronic element 10 and the interposer board 20, there are cases where alignment using a camera is performed. In these cases, photographing is performed from the side of the interposer board 20. When the mark portion 25 is provided on the board main surface AK2 in the vicinity of the circuit board, the mark portion 25 is visible during the alignment using a camera. Therefore, the alignment is easily performed.

The solder layer 40 includes the solder unfilled region 41. In the solder unfilled region 41, the solder is not filled. The solder unfilled region 41 defines and functions as the cavity region 41A, the flux region 41B, or the cushioning region 41C. The solder layer 40 includes the solder unfilled region 41. With such a configuration, cushioning properties can be provided between the electronic element 10 and the interposer board 20. As a result, it is possible to reduce the transmission of impact to the electronic element 10 when an impact acts on the circuit board 90.

Before forming the metal layer on the board side surface BK of the interposer board 20, the Zn-containing layer 26 is formed by the Zn-containing layer forming process, which is a zincate treatment. Since the Zn-containing layer 26 is formed on the board side surface BK in this way, the adhesion of the metal layers formed on the board side surface BK such as the Cu layer 27, the Ni plated layer 28, and the second Sn plated layer 29 is improved.

Second Preferred Embodiment

Next, a second preferred embodiment of the present invention will be described. In the first preferred embodiment of the present invention, in the Zn-containing layer forming process in Step S7, the Zn-containing layer 26 is formed on the board side surface BK of the interposer board 20. In contrast, in the second preferred embodiment of the present invention, as Step S7, for example, a Pd (palladium)-containing layer forming process is performed, instead of the Zn-containing layer forming process. As a result, a Pd-containing layer 26a shown as a common portion with the Zn-containing layer 26 in FIG. 2 is formed. The application of Pd is not limited to this. The application of Pd is performed using, for example, the following (1) method of holding by an elastic body holder, or (2) method of holding by an adhesive layer.

(1) Method of Holding by Elastic Body Holder

Figure 8:
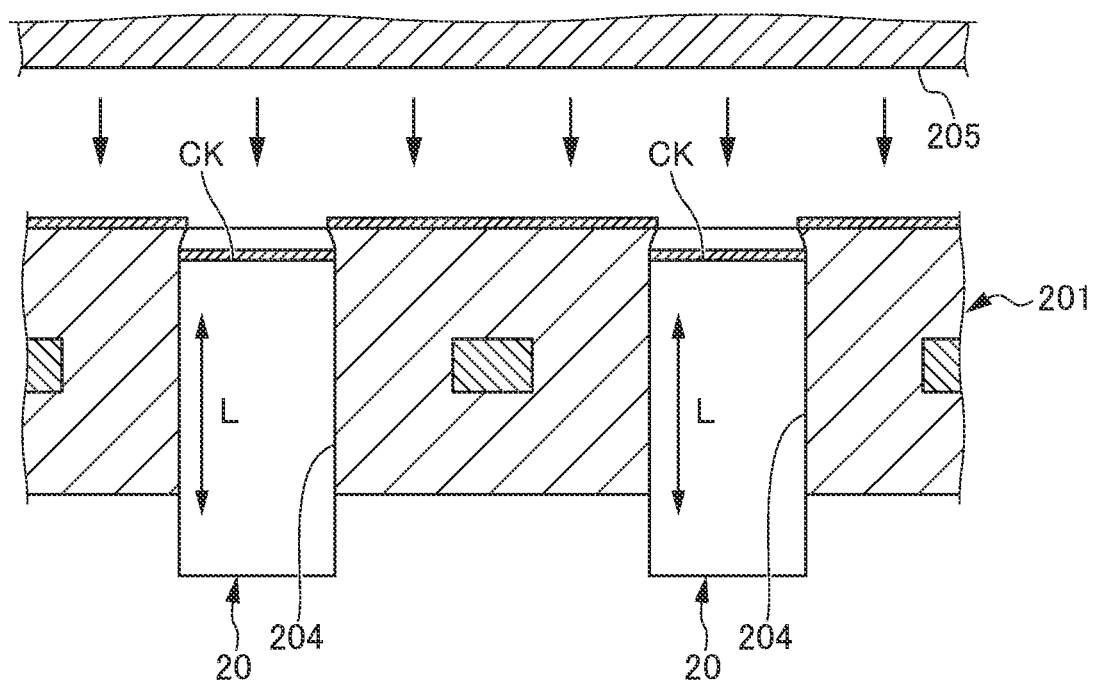
FIG. 8 is a diagram of a method of holding an interposer board 20 by an elastic body holder 201 according to another preferred embodiment of the present invention.

FIG. 8 is a diagram of a non-limiting example of a method of holding the interposer board 20 by an elastic body holder 201. The elastic body holder 201 is a plate-shaped member made of, for example, a silicone-based or fluorine-based rubber.

The elastic body holder 201 includes a holding hole 204 that receives the interposer board 20, for example, in the length direction L. The inner dimension of the holding hole 204 may be smaller than the cross-sectional dimension of the interposer board 20. Therefore, when the interposer board 20 is inserted into the holding hole 204, the interposer board 20 is held in close contact.

Next, for example, by sputtering as the dry plating method, the step of adhering Pd on the board end surface CK of the interposer board 20 is performed. In the case of sputtering, the elastic body holder 201 is opposed to the target 205. Then, in the interposer board 20 held by the elastic body holder 201, the metal particles are spattered toward the board end surface CK facing the opening side of the holding hole 204, as indicated by the arrow. As a result, a metal film is formed on the board end surface CK, such that Pd is formed.

(2) Method of Holding by Adhesive Layer

Figure 9:
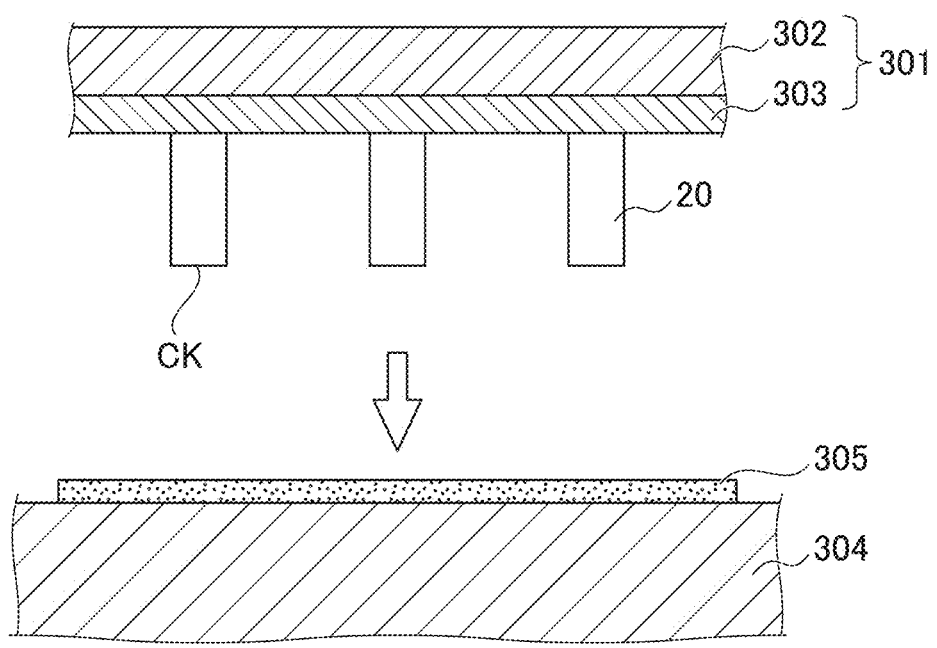
FIG. 9 is a view of a method of holding the interposer board 20 by a holder 301 including an adhesive film 303 according to another preferred embodiment of the present invention.

FIG. 9 is a diagram of a non-limiting example of a method of holding the interposer board 20 by a holder 301 including an adhesive film 303. The holder 301 includes a base material 302 and an adhesive film 303 made of an elastic body such as, for example, silicon rubber. For example, a chip aligner (not shown) is used to press the plurality of interposer boards 20 provided in line against the adhesive film 303. As a result, the interposer boards 20 are adhered to the adhesive film 303, and aligned with and held by each holder 301 as shown in FIG. 9.

On the other hand, a Pd catalyst 305 is provided on a platen 304 with a predetermined thickness. The holder 301 holding the interposer board 20 is brought close to the platen 304 with the interposer board 20 facing downward, as indicated by the arrow. As a result, one of the board end surfaces CK of the interposer board 20 is dipped into the Pd catalyst. The interposer board 20 is then lifted from the Pd catalyst. As a result, a Pd film is formed on the board end surface CK of the interposer board 20. Similarly, a Pd film is also formed on the other one of the board end surfaces CK of the interposer board 20.

The Pd-containing layer is formed on the board side surface BK of the interposer board 20 by using (1) the method of holding by the elastic body holder or (2) the method of holding by the adhesive layer. Except for the Pd including-containing layer forming process of Step S7, the processes are the same or substantially the same as those of the first preferred embodiment of the present invention. Therefore, their descriptions are omitted.

Also in the second preferred embodiment of the present invention, the Cu layer 27 is formed after the Pd-containing layer forming process, as in the first preferred embodiment of the present invention. However, in the second preferred embodiment of the present invention, the Cu layer 27 is formed by, for example, electroless plating. During Cu plating, although Pd is replaced by Cu, not all Zn of the Pd-containing layer is replaced, and a portion of Pd remains on the board side surface BK, such that the Pd-containing layer remains thin.

Also in the second preferred embodiment of the present invention, since Pd is replaced with Cu at the time of Cu plating, the adhesiveness of the Cu layer 27, the Ni plated layer 28, and the second Sn plated layer 29, which are metal layers provided on the board side surface BK, is improved as in the first preferred embodiment of the present invention. Furthermore, the other advantageous effects are the same or substantially the same as those of the first preferred embodiment of the present invention.

Third Preferred Embodiment

Next, a third preferred embodiment of the present invention will be described. In the first preferred embodiment of the present invention, in the Zn-containing layer forming process of Step S7, the Zn-containing layer is formed on the board side surface BK of the interposer board 20. In contrast, in the third preferred embodiment of the present invention, as Step S7, a Cu-containing layer forming process is performed, instead of the Zn-containing layer forming process. As a result, a Cu-containing layer 26b shown as a common portion with the Zn-containing layer 26 in FIG. 2 is formed. The application of Cu is not limited to this. The application of Cu is performed, for example, in the same or substantially the same manner as in the second preferred embodiment of the present invention using (1) the method of holding by the elastic body holder or (2) the method of holding by the adhesive layer.

Using (1) the method of holding by the elastic body holder or (2) the method of holding by the adhesive layer, the Cu-containing layer is formed on the board side surface BK of the interposer board 20. Except for the Cu-containing layer forming process of Step S7, the processes are the same or substantially the same as those of the first preferred embodiment of the present invention. Therefore, their descriptions are omitted.

Also in the third preferred embodiment of the present invention, the Cu layer 27 is formed by Cu plating after the Cu-containing layer forming process, as in the first preferred embodiment of the present invention. Therefore, the Cu-containing layer remains inside the Cu layer 27 formed by Cu plating.

Also in the third preferred embodiment of the present invention, since the Cu-containing layer is formed when performing Cu plating, the adhesiveness of the Cu layer 27, the Ni plated layer 28, and the second Sn plated layer 29, which are metal layers formed on the board side surface BK, is improved as in the first preferred embodiment of the present invention. Furthermore, the other advantageous effects are the same or substantially the same as those of the first preferred embodiment of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
   an electronic element; and
   an interposer board; wherein
   the electronic element includes:
      a rectangular or substantially rectangular multilayer body including dielectric layers and internal electrode layers which are alternately laminated, a pair of multilayer body end surfaces orthogonal or substantially orthogonal to the internal electrode layers, a pair of multilayer body side surfaces orthogonal or substantially orthogonal to the multilayer body end surfaces, and a pair of multilayer body main surfaces orthogonal or substantially orthogonal to the multilayer body end surfaces and the multilayer body side surfaces; and
      external electrodes each on a respective one of the pair of multilayer body end surfaces of the multilayer body and connected to the internal electrode layers;
   the interposer board including a pair of board end surfaces, a pair of board side surfaces orthogonal or substantially orthogonal to the board end surfaces, and a pair of board main surfaces orthogonal or substantially orthogonal to the board end surfaces and the board side surfaces;
   one of the pair of board main surfaces is located in a vicinity of the electronic element and joined with one of the pair of multilayer body main surfaces in a vicinity of the interposer board;
   the interposer board is an alumina board;
   a solder layer is provided between the electronic element and the interposer board, joins the electronic element with the interposer board, and includes a solder unfilled region; and
   the solder unfilled region includes a flux region including a flux, a cavity region, and a cushioning region including a cushioning material different from open cavities.

2. The electronic component according to claim 1, wherein
   the interposer board includes a recess in each of the pair of board end surfaces.

3. The electronic component according to claim 1, wherein, in the electronic element, a length between the pair of multilayer body end surfaces is about 2.01 mm to about 2.20 mm, a width between the pair of multilayer body side surfaces is about 1.30 mm to about 1.50 mm, a thickness between the pair of multilayer body main surfaces is about 1.70 mm to about 1.9 mm, a thickness of each of the dielectric layers is about 0.4 μm to about 0.8 μm, and a thickness of each of the internal electrode layers is about 0.4 μm to about 0.8 μm.

4. The electronic component according to claim 1, wherein, in the electronic element, a length between the pair of multilayer body end surfaces is about 3.1 mm to about 3.3 mm, a width between the pair of multilayer body side surfaces is about 1.5 mm to about 2.7 mm, a thickness between the pair of multilayer body main surfaces is about 1.5 mm to about 2.7 mm, a thickness of each of the dielectric layers is about 0.4 μm to about 0.8 μm, and a thickness of each of the internal electrode layers is about 0.4 μm to about 0.8 μm.

5. The electronic component according to claim 1, wherein each of the external electrodes includes an electrically conductive resin layer.

6. The electronic component according to claim 5, wherein each of the external electrodes includes a Cu electrode layer between the respective multilayer body end surface and the electrically conductive resin layer; and each of the external electrodes includes a gap between the Cu electrode layer and the electrically conductive resin layer.

7. The electronic component according to claim 6, wherein each of the Cu electrode layers extends onto a portion of each of the pair of multilayer main body main surfaces and the pair of multilayer body side surfaces.

8. The electronic component according to claim 5, wherein each of the external electrodes includes a Ni plated layer on the electrically conductive resin layer.

9. The electronic component according to claim 8, wherein each of the external electrodes includes an Sn plated layer on the Ni plated layer.

10. The electronic component according to claim 8, wherein each of the Ni plated layers extends onto a portion of each of the pair of multilayer main body main surfaces and the pair of multilayer body side surfaces.

11. The electronic component according to claim 5, wherein each of the electrically conductive resin layers includes a thermosetting resin and a metal component.

12. The electronic component according to claim 11, wherein the thermosetting resin includes at least one of epoxy resin, phenolic resin, urethane resin, silicone resin, or polyimide resin.

13. The electronic component according to claim 11, wherein the metal component includes Ag or a metal powder coated with Ag on a surface of the base metal powder.

14. The electronic component according to claim 5, wherein each of the electrically conductive resin layers extends onto a portion of each of the pair of multilayer main body main surfaces and the pair of multilayer body side surfaces.

15. The electronic component according to claim 1, wherein each of the dielectric layers includes barium titanate as a main component.

16. The electronic component according to claim 15, wherein each of the dielectric layers further includes at least one of Mn compounds, Fe compounds, Cr compounds, Co compounds and Ni compounds as a sub-component.

17. The electronic component according to claim 1, wherein each of the internal electrode layers includes Ni as a main component.

* * * * *